US009607855B2

(12) United States Patent
Takahashi et al.

(10) Patent No.: US 9,607,855 B2
(45) Date of Patent: Mar. 28, 2017

(54) ETCHING METHOD AND STORAGE MEDIUM

(71) Applicant: TOKYO ELECTRON LIMITED, Tokyo (JP)

(72) Inventors: Nobuhiro Takahashi, Nirasaki (JP); Masashi Matsumoto, Beaverton, OR (US); Ayano Hagiwara, Nirasaki (JP); Koji Takeya, Nirasaki (JP); Junichiro Matsunaga, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/013,257

(22) Filed: Feb. 2, 2016

(65) Prior Publication Data

US 2016/0225637 A1 Aug. 4, 2016

(30) Foreign Application Priority Data

Feb. 3, 2015 (JP) ................................. 2015-019114

(51) Int. Cl.
*H01L 21/306* (2006.01)
*H01L 21/3213* (2006.01)
*H01L 21/3065* (2006.01)
*H01L 21/67* (2006.01)

(52) U.S. Cl.
CPC .... *H01L 21/32135* (2013.01); *H01L 21/3065* (2013.01); *H01L 21/67017* (2013.01); *H01L 21/67069* (2013.01)

(58) Field of Classification Search
None
See application file for complete search history.

(56) References Cited

U.S. PATENT DOCUMENTS

| 5,505,816 A * | 4/1996 | Barnes .............. H01L 21/31116 257/E21.252 |
| 7,611,995 B2 * | 11/2009 | Hasebe ............. H01L 21/31116 438/714 |
| 9,269,628 B1 * | 2/2016 | Jacob .............. H01L 21/823431 |
| 2010/0184274 A1 * | 7/2010 | Coronel ............ H01L 29/42392 438/479 |
| 2011/0260040 A1 * | 10/2011 | Wieland ................. B82Y 10/00 250/208.2 |
| 2012/0129354 A1 * | 5/2012 | Luong ................ H01L 21/6831 438/714 |
| 2012/0146152 A1 * | 6/2012 | Dove ..................... H01L 29/78 257/368 |

(Continued)

FOREIGN PATENT DOCUMENTS

| JP | 2003-077888 A | 3/2003 |
| JP | 2009-510750 A | 3/2009 |
| JP | 2013-225604 A | 10/2013 |

*Primary Examiner* — Allan Olsen
(74) *Attorney, Agent, or Firm* — Nath, Goldberg & Meyer; Jerald L. Meyer

(57) ABSTRACT

An etching method includes: disposing a target substrate including a silicon and a silicon-germanium within a chamber; and performing both of selectively etching the silicon-germanium with respect to the silicon and selectively etching the silicon with respect to the silicon-germanium by varying ratios of $F_2$ gas and $NH_3$ gas in an etching gas that has a gas system including the $F_2$ gas and the $NH_3$ gas.

10 Claims, 6 Drawing Sheets

(56) References Cited

U.S. PATENT DOCUMENTS

| | | | |
|---|---|---|---|
| 2013/0023125 A1* | 1/2013 | Singh | H01L 21/3065 438/706 |
| 2014/0151746 A1* | 6/2014 | Loubet | H01L 29/66795 257/192 |
| 2015/0001588 A1* | 1/2015 | Gunji | H01L 21/02587 257/200 |
| 2015/0126039 A1* | 5/2015 | Korolik | H01L 21/3065 438/718 |
| 2015/0126040 A1* | 5/2015 | Korolik | H01L 21/3065 438/718 |
| 2015/0263088 A1* | 9/2015 | Cheng | H01L 29/0673 257/20 |
| 2015/0357187 A1* | 12/2015 | Morimoto | H01L 21/76892 438/4 |
| 2016/0005621 A1* | 1/2016 | Toda | H01L 21/31116 438/734 |
| 2016/0047781 A1* | 2/2016 | Koley | B81B 3/0029 73/643 |
| 2016/0049281 A1* | 2/2016 | Berry, III | H01J 37/36 156/345.26 |
| 2016/0049309 A1* | 2/2016 | Tapily | H01L 21/31116 438/703 |
| 2016/0056033 A1* | 2/2016 | Sardashti | H01L 21/0228 438/763 |

* cited by examiner

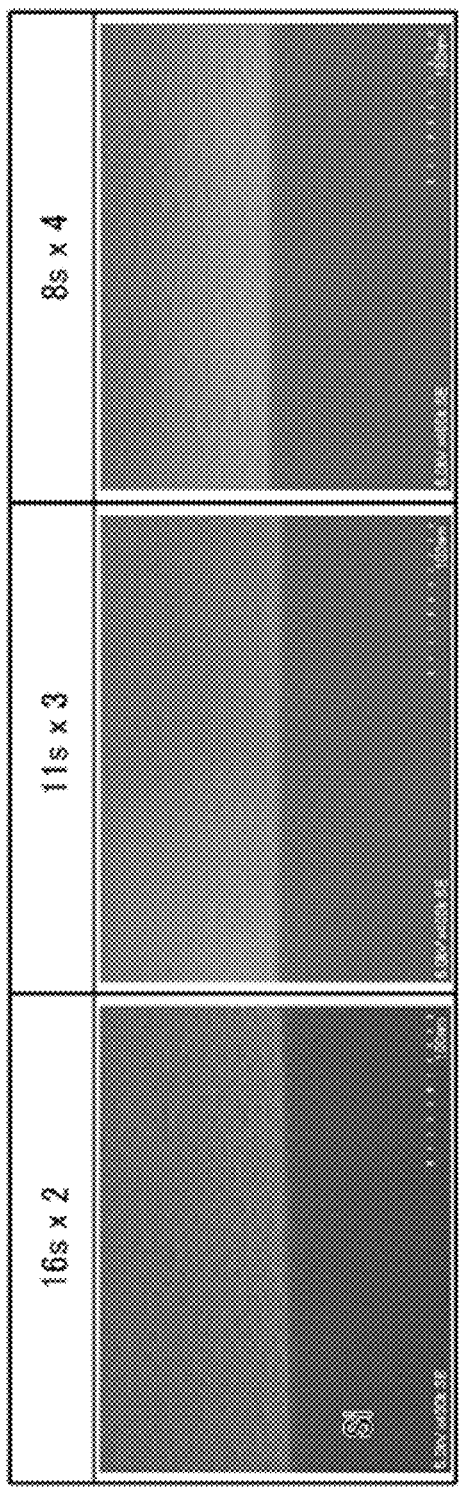

ETCHING METHOD AND STORAGE MEDIUM

CROSS-REFERENCE TO RELATED APPLICATION

This application claims the benefit of Japanese Patent Application No. 2015-019114, filed on Feb. 3, 2015, in the Japan Patent Office, the disclosure of which is incorporated herein in its entirety by reference.

TECHNICAL FIELD

The present disclosure relates to an etching method of etching one of a silicon-germanium (i.e., a SiGe) and a silicon (i.e., a Si) at a high selection ratio with respect to the other in a target substrate in which the SiGe and the Si coexist, and a non-transitory computer-readable storage medium.

BACKGROUND

In recent years, a technique of selectively etching one of a SiGe and a Si with respect to the other in the target substrate where the SiGe and the Si coexist is required. As an example, there is provided a technique of selectively side-etching one of a Si and a SiGe with respect to the other in a target substrate that has a laminated structure of the Si and the SiGe.

To meet the requirements, as a technique of selectively etching a SiGe with respect to a Si, there are known a technique of performing the selective etching by using $ClF_3$ and $XeF_2$ as an etching gas and another technique of performing the selective etching by using HF as an etching gas. Further, as a technique of selectively etching a Si with respect to a SiGe, there is known a technique of performing the selective etching by using an etching gas including $SF_6$ and $CF_4$ to which a germanium-containing gas is added.

In the aforementioned techniques, either selectively etching the SiGe with respect to the Si or selectively etching the Si with respect to the SiGe is performed. However, it is required that both of selectively etching the SiGe with respect to the Si and selectively etching the Si with respect to the SiGe be performed in the same apparatus using the same gas system.

SUMMARY

Therefore, the present disclosure provide an etching method in which both of selectively etching a SiGe with respect to a Si and selectively etching a Si with respect to a SiGe in a target substrate, in which the SiGe and the Si coexist, are performed in the same apparatus using the same gas system.

According to one aspect of the present disclosure, there is provided an etching method, including: disposing a target substrate including a silicon and a silicon-germanium within a chamber; and performing both of selectively etching the silicon-germanium with respect to the silicon and selectively etching the silicon with respect to the silicon-germanium by varying ratios of $F_2$ gas and $NH_3$ gas in an etching gas that has a gas system including $F_2$ gas and $NH_3$ gas.

According to another aspect of the present disclosure, there is provided a non-transitory computer-readable storage medium storing a program that operates on a computer and controls an etching apparatus, wherein the program, when executed, causes the computer to control the etching apparatus so as to perform the aforementioned etching method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is an SEM photograph showing a state of an etched surface of a wafer that has a poly-Si film, when the etching was performed with respect to the wafer by varying the number of cycles.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<One Example of Processing System used in Embodiments of the Present Disclosure>

Figure 1:
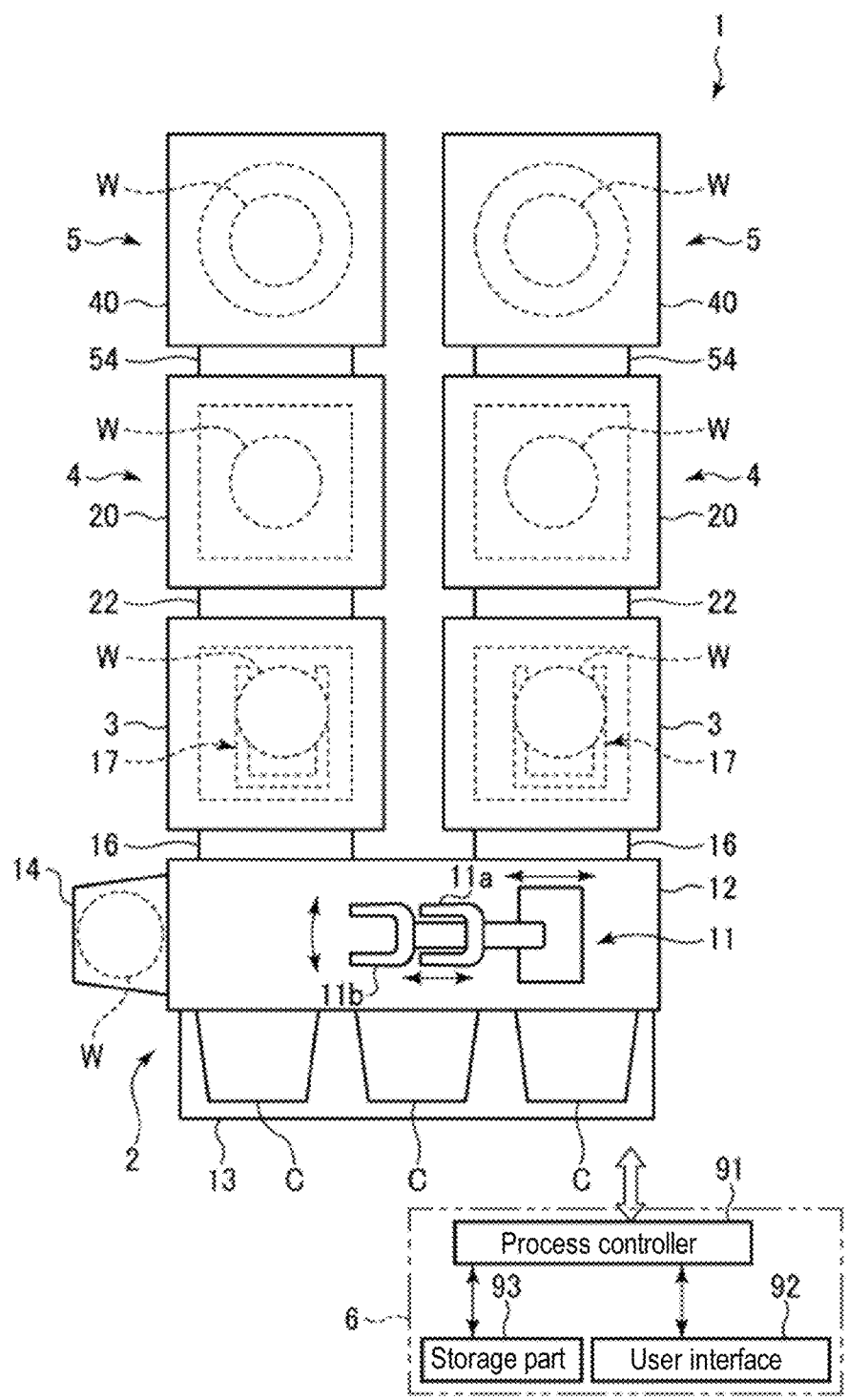
FIG. 1 is a schematic configuration view showing one example of a processing system equipped with an etching apparatus that performs an etching method according to an embodiment of the present disclosure.

FIG. 1 is a schematic configuration view showing one example of a processing system equipped with an etching apparatus that performs an etching method according to one embodiment of the present disclosure. A processing system 1 includes: a loading/unloading part 2 configured to load and unload a semiconductor wafer (hereinafter simply referred to as a "wafer") W as a target substrate in which a SiGe and a Si coexist; two load lock chambers (L/L) 3 disposed adjacent to the loading/unloading part 2; two heat treatment apparatuses 4 disposed adjacent to the corresponding load lock chambers 3 and configured to perform a heat treatment with respect to the wafer W; two etching apparatuses 5 according to the present embodiment, which are disposed adjacent to the corresponding heat treatment apparatuses 4 and configured to perform etching with respect to the wafer W; and a control part 6.

The loading/unloading part 2 includes a transfer chamber (L/M) 12 within which a first wafer transfer mechanism 11 for transferring the wafer W is installed. The first wafer transfer mechanism 11 includes two transfer arms 11a and 11b configured to hold the wafer W in a substantially horizontal posture. A mounting stage 13 is installed at one longitudinal side of the transfer chamber 12. The mounting stage 13 is configured to connect one or more, for example, three, carriers C capable of accommodating a plurality of wafers W. In addition, an orienter 14 configured to perform a position alignment by rotating the wafer W and finding an eccentric amount thereof is installed adjacent to the transfer chamber 12.

In the loading/unloading part 2, the wafer W is held by one of the transfer arms 11a and 11b and is moved linearly within a substantially horizontal plane or moved up and down by the operation of the first wafer transfer mechanism 11, thereby being transferred to a desired position. Further, the wafer W is loaded or unloaded with respect to the carriers C mounted on the mounting stage 13, the orienter 14 and the load lock chambers 3, as the transfer arms 11a and 11b move toward or away from the carriers C, the orienter 14 and the load lock chambers 3.

Each of the load lock chambers 3 is connected to the transfer chamber 12 with a gate valve 16 interposed between each of the load lock chambers 3 and the transfer chamber 12. A second wafer transfer mechanism 17 for transferring the wafer W is installed within each of the load lock chambers 3. Each of the load lock chambers 3 is configured such that it can be evacuated to a predetermined vacuum degree.

The second wafer transfer mechanism 17 has an articulated arm structure and includes a pick configured to hold the wafer W in a substantially horizontal posture. In the second wafer transfer mechanism 17, the pick is positioned within each of the load lock chambers 3 when an articulated arm is retracted. The pick can reach a corresponding heat treatment apparatus 4 as the articulated arm is extended and can reach a corresponding etching apparatus 5 as the articulated arm is further extended. Thus, the second wafer transfer mechanism 17 can transfer the wafer W between the load lock chamber 3, the heat treatment apparatus 4 and the etching apparatus 5.

Figure 2:
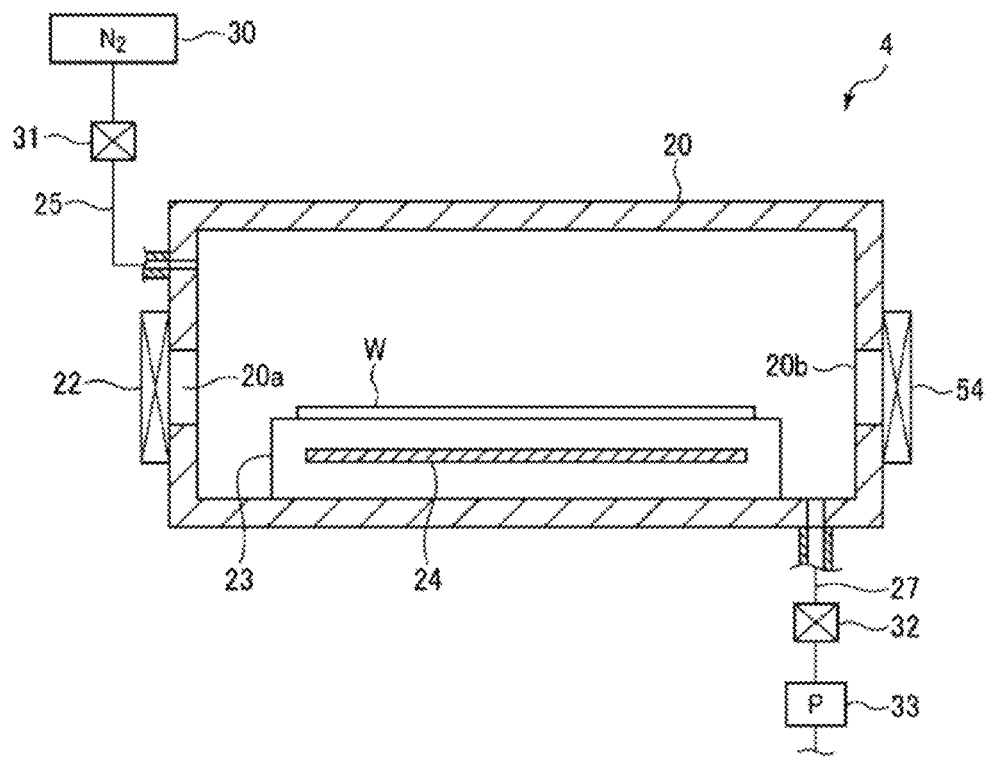
FIG. 2 is a sectional view showing a heat treatment apparatus equipped in the processing system shown in FIG. 1.

As shown in FIG. 2, each of the heat treatment apparatuses 4 includes a vacuum-evacuable chamber 20 and a mounting table 23 configured to mount the wafer W within the chamber 20. A heater 24 is embedded in the mounting table 23. After being subjected to an etching process, the wafer W is heated by the heater 24, thereby vaporizing and removing etching residue which exists on the wafer W. A loading/unloading gate 20a through which the wafer W is transferred between the heat treatment apparatuses 4 and corresponding load lock chambers 3 is installed in the sidewall of the chamber 20 adjoining the load lock chamber 3. The loading/unloading gate 20a is opened and closed by a gate valve 22. In addition, a loading/unloading gate 20b through which the wafer W is transferred between the heat treatment apparatuses 4 and corresponding etching apparatuses 5 is installed in the sidewall of the chamber 20 adjoining the etching apparatus 5. The loading/unloading gate 20b is opened and closed by a gate valve 54. A gas supply path 25 is connected to an upper portion of the sidewall of the chamber 20. The gas supply path 25 is connected to an $N_2$ gas supply source 30. An exhaust path 27 is connected to the bottom wall of the chamber 20. The exhaust path 27 is connected to a vacuum pump 33. A flow rate adjusting valve 31 is installed in the gas supply path 25. A pressure adjusting valve 32 is installed in the exhaust path 27. By controlling the flow rate adjusting valve 31 and the pressure adjusting valve 32, the interior of the chamber 20 is kept in a $N_2$ gas atmosphere having a predetermined pressure. In this state, a heat treatment is performed. Instead of the $N_2$ gas, other inert gases such as Ar gas or the like may be used.

The control part 6 includes a process controller 91 provided with a microprocessor (computer) which controls the respective constituent parts of the processing system 1. A user interface 92, which includes a keyboard that allows an operator to perform a command input operation or the like in order to manage the processing system 1 and a display that visualizes and displays an operation status of the processing system 1, is connected to the process controller 91. Also connected to the process controller 91 is a storage part 93 which stores: control programs for realizing, under the control of the process controller, various types of processes performed in the processing system 1, for example, supply of a treatment gas and evacuation of the interior of the chamber in each of the etching apparatuses 5 to be described later; process recipes which are control programs for allowing the respective constituent parts of the processing system 1 to perform specified processes according to process conditions; and various types of databases. The recipes are stored in a suitable storage medium (not shown) of the storage part 93. If necessary, an arbitrary recipe is called out from the storage part 93 and is executed by the process controller 91. In this way, desired processes are performed in the processing system 1 under the control of the process controller 91.

The etching apparatuses 5 according to the present embodiment are configured to perform both of selectively etching a SiGe with respect to a Si and selectively etching a Si with respect to SiGe by using the same gas system. A detailed configuration of the etching apparatuses 5 will be described later.

In the processing system 1, a wafer including a SiGe and a Si as the etched target is used as the wafer W. A plurality of wafers W of this type is accommodated within the carriers C and is transferred to the processing system 1.

In the processing system 1, one of the wafers W is transferred from the carriers C mounted in the loading/unloading part 2 to one of the load lock chambers 3 by one of the transfer arms 11a and 11b of the first wafer transfer mechanism 11 while keeping the atmosphere-side gate valve 16 open, and is delivered to the pick of the second wafer transfer mechanism 17 disposed within the load lock chamber 3.

Thereafter, the atmosphere-side gate valve 16 is closed and the interior of the load lock chamber 3 is evacuated. Subsequently, the gate valve 54 is opened and the pick is extended into a corresponding etching apparatus 5, so that the wafer W is transferred to the etching apparatus 5.

Thereafter, the pick is returned to the load lock chamber 3 and the gate valve 54 is closed. Then, an etching process is performed within the etching apparatus 5 in the below-described manner.

After the etching process is completed, the gate valves 22 and 54 are opened. The etched wafer W is transferred to the heat treatment apparatus 4 by the pick of the second wafer transfer mechanism 17. While $N_2$ gas is introduced into the chamber 20, the wafer W mounted on the mounting table 23 is heated by the heater 24, thereby thermally removing etching residue or the like.

After the heat treatment is completed in the heat treatment apparatus 4, the gate valve 22 is opened. The etched wafer W mounted on the mounting table 23 is moved to the load lock chamber 3 by the pick of the second wafer transfer mechanism 17. Then, the etched wafer W is returned to one of the carriers C by one of the transfer arms 11*a* and 11*b* of the first wafer transfer mechanism 11. Thus, a process for one wafer is completed.

In the processing system 1, the heat treatment apparatuses 4 are not essential. In cases where no heat treatment apparatus is installed at the processing system 1, the wafer W after being subjected to the etching process may be moved to one of the load lock chambers 3 by the pick of the second wafer transfer mechanism 17 and then returned to one of the carriers C by one of the transfer arms 11*a* and 11*b* of the first wafer transfer mechanism 11.

<Configuration of Etching Apparatus>

Next, the etching apparatus 5 according to the present embodiment will be described in detail.

Figure 3:
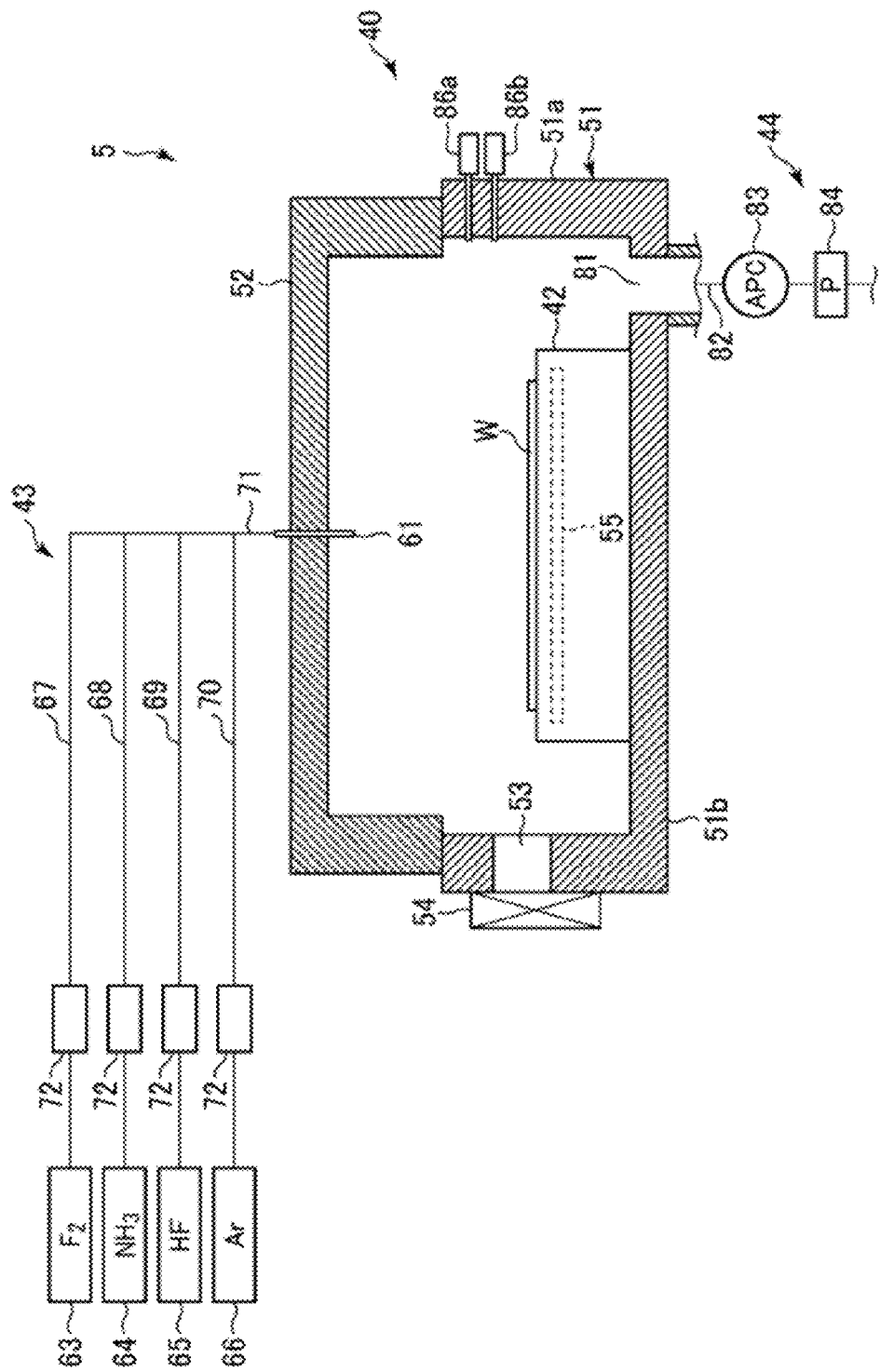
FIG. 3 is a sectional view showing an etching apparatus equipped in the processing system shown in FIG. 1.

FIG. 3 is a sectional view showing the etching apparatus according to the present embodiment. As shown in FIG. 3, the etching apparatus 5 includes a chamber 40 having a sealed structure. A mounting table 42 configured to mount the wafer W in a substantially horizontal posture is installed within the chamber 40. The etching apparatus 5 further includes a gas supply mechanism 43 configured to supply an etching gas to the chamber 40 and an evacuation mechanism 44 configured to evacuate the interior of the chamber 40.

The chamber 40 is configured by a chamber body 51 and a cover portion 52. The chamber body 51 includes a substantially cylindrical sidewall portion 51*a* and a bottom portion 51*b*. The upper portion of the chamber body 51 is opened. This opening is closed by the cover portion 52. The sidewall portion 51*a* and the cover portion 52 are sealed by a seal member (not shown), thereby securing the air-tightness of the interior of the chamber 40. A gas introduction nozzle 61 is inserted through the ceiling wall of the cover portion 52 so as to extend from above toward the interior of the chamber 40.

A loading/unloading gate 53 through which the wafer W is loaded and unloaded between the chamber 40 of the etching apparatus 5 and the chamber 20 of the heat treatment apparatus 4 is installed in the sidewall portion 51*a*. The loading/unloading gate 53 is opened and closed by a gate valve 54.

The mounting table 42 has a substantially circular shape when viewed from the top, and is fixed to the bottom portion 51*b* of the chamber 40. A temperature controller 55 configured to control the temperature of the mounting table 42 is installed within the mounting table 42. The temperature controller 55 includes a pipe line through which a temperature control medium (e.g., water, etc.) circulates. By heat exchange between the mounting table 42 and the temperature control medium flowing through the pipe line, the temperature of the mounting table 42 is controlled and hence the temperature of the wafer W mounted on the mounting table 42 is controlled.

The gas supply mechanism 43 includes a $F_2$ gas supply source 63 which supplies $F_2$ gas, a $NH_3$ gas supply source 64 which supplies $NH_3$ gas, a HF gas supply source 65 which supplies HF gas, and an Ar gas supply source 66 which supplies Ar gas. The gas supply mechanism 43 further includes a $F_2$ gas supply pipe 67 connected to the $F_2$ gas supply source 63, a $NH_3$ gas supply pipe 68 connected to the $NH_3$ gas supply source 64, a HF gas supply pipe 69 connected to the HF gas supply source 65, and an Ar gas supply pipe 70 connected to the Ar gas supply source 66. These gas supply pipes 67 to 70 are connected to a collective pipe 71, which is connected to the gas introduction nozzle 61 mentioned above. Thus, $F_2$ gas, $NH_3$ gas, HF gas, and Ar gas are introduced from the gas introduction nozzle 61 into the chamber 40 via the gas supply pipes 67 to 70 and the collective pipe 71.

Flow rate controllers 72 configured to perform a flow path opening/closing operation and a flow rate control are installed in the $F_2$ gas supply pipe 67, the $NH_3$ gas supply pipe 68, HF gas supply pipe 69, and the Ar gas supply pipe 70. For example, each of the flow rate controllers 72 includes an opening/closing valve and a mass flow controller.

A shower plate may be installed in the upper portion of the chamber 40 to supply excited gases in a shower-like manner.

Among the aforementioned gases, $F_2$ gas and $NH_3$ gas are etching gases used for a main etching. In addition, HF gas is used for removing the natural oxide film or terminating films after being etched. In addition, Ar gas is used as a dilution gas or a purge gas. Instead of the Ar gas, other inert gas such as $N_2$ gas may be used in some embodiments, or two or more inert gases may be used in some embodiments.

The evacuation mechanism 44 includes an exhaust pipe 82 connected to an exhaust port 81 formed in the bottom portion 51*b* of the chamber 40. The evacuation mechanism 44 further includes an automatic pressure control valve (APC) 83, which is installed in the exhaust pipe 82 and configured to control the internal pressure of the chamber 40, and a vacuum pump 84 configured to evacuate the interior of the chamber 40.

In the sidewall of the chamber 40, two capacitance manometers 86*a* and 86*b* as pressure gauges for measuring the internal pressure of the chamber 40 are installed such that the capacitance manometers 86*a* and 86*b* are inserted into the chamber 40. The capacitance manometer 86*a* is used to measure a high pressure while the capacitance manometer 86*b* is used to measure a low pressure. A temperature sensor (not shown) for detecting the temperature of the wafer W is installed near the wafer W mounted on the mounting table 42.

Aluminum is used as the material of the respective constituent parts, such as the chamber 40 and the mounting table 42, which constitute the etching apparatus 5. The aluminum material which constitutes the chamber 40 may be a pure aluminum material or an aluminum material having an anodized inner surface (the inner surface of the chamber body 51, etc.). On the other hand, the surface of the aluminum material which constitutes the mounting table 42 requires wear resistance. Therefore, an oxide film (e.g., $Al_2O_3$ film) having high wear resistance may be in some embodiments formed on the surface of the aluminum material by anodizing the aluminum material.

<Etching Method using Etching Apparatus>

Next, a description will be made on an etching method using the etching apparatus configured as above.

In the present embodiment, using a wafer in which a Si and a SiGe coexist as a target wafer W, selectively etching a SiGe with respect to a Si and selectively etching the Si with respect to the SiGe are performed. As an example, when a poly-Si film and a SiGe film are laminated, selectively etching one of the poly-Si film and the SiGe film with respect to the other may be performed.

In the etching method of the present embodiment, while the gate valve 54 of the etching apparatus 5 is kept open, the wafer W is loaded from the loading/unloading gate 53 into the chamber 40 and then mounted on the mounting table 42 by the pick of the second wafer transfer mechanism 17 disposed within the load lock chamber 3. The mounting table 42 is temperature-adjusted by the temperature controller 55 such that the temperature of the wafer W mounted on the mounting table 42 is controlled to a predetermined temperature.

Thereafter, the pick is returned to the load lock chamber 3. The gate valve 54 is closed to keep the interior of the chamber 40 in a sealed state.

Subsequently, while the pressure in the chamber 40 is adjusted, the natural oxide film formed on the wafer W by introducing $NH_3$ gas and HF gas into the chamber 40 is removed. In this case, in addition to $NH_3$ gas and HF gas, Ar gas may be used as a dilution gas. Further, in some embodiments, after the pressure in the chamber is stabilized by introducing $NH_3$ gas into the chamber 40, HF gas may be introduced.

Thereafter, while Ar gas as a purge gas is supplied to the chamber 40, the interior of the chamber 40 is evacuated so as to purge the interior of the chamber 40. Subsequently, instead of Ar gas, $F_2$ gas and $NH_3$ gas are supplied to the chamber 40, and a main etching is performed using an etching gas having a gas system including $F_2$ gas and $NH_3$ gas. At this time, Ar gas as a diluent gas may be added. In the main etching, selectively etching the SiGe with respect to the Si and selectively etching the Si with respect to the SiGe may be performed by varying ratios of $NH_3$ gas and $F_2$ gas. In other words, when an etching gas having a gas system including $F_2$ gas and $NH_3$ gas is used in the main etching, selectively etching the SiGe with respect to the Si may be performed in an area where the ratio of $F_2$ gas is high (including a case where the ratio of $F_2$ gas is 100%) because the SiGe is etched by the $F_2$ gas and the Si is hardly etched by the $F_2$ gas. On the other hand, selectively etching the Si with respect to the SiGe may be performed when the ratio of $NH_3$ gas becomes high, because Si is etched and SiGe is protected and hardly etched by the $NH_3$ gas.

Specifically, when selectively etching the SiGe with respect to the Si is performed, a volume ratio of the $NH_3$ gas to the total sum of the $F_2$ gas and the $NH_3$ gas may fall within a range from 0 to 15 volume % (flow rate %) (i.e., a ratio of the $F_2$ gas ranges from 85 to 100%) in some embodiments. Further, when selectively etching the Si with respect to the SiGe is performed, a volume ratio of the $NH_3$ gas to the total sum of the $F_2$ gas and the $NH_3$ gas may fall within a range from 18 to 50 volume % (flow rate %) (i.e., a ratio of the $F_2$ gas ranges from 50 to 82%) in some embodiments. Thus, a selective etching with substantially two or more selection ratios may be performed. When selectively etching the SiGe with respect to the Si is performed, a volume ratio of the $NH_3$ gas to the total sum of the $F_2$ gas and the $NH_3$ gas may fall within a range from 0 to 10 volume % (flow rate %) in some embodiments, and when selectively etching the Si with respect to the SiGe is performed, a volume ratio of the $NH_3$ gas to the total sum of the $F_2$ gas and the $NH_3$ gas may fall within a range from 30 to 50 volume % (flow rate %) in some embodiments. Thus, a selective etching with substantially ten or more selection ratios may be performed.

From the viewpoint of increasing the selection ratio of the SiGe with respect to the Si, it may be preferable that the ratio of $F_2$ gas is 100% (i.e., the ratio of $NH_3$ gas is 0%). However, an etching rate may be adjusted by adding an appropriate amount of the $NH_3$ gas.

During the main etching, the internal pressure of the chamber 40 may fall within a range from 66.7 to 667 Pa (i.e., 0.5 to 5 Torr) for any of selectively etching SiGe with respect to Si or selectively etching Si with respect to SiGe. Further, the temperature of the mounting table 42 (substantially, a temperature of the wafer) may fall within a range from 30 to 130 degrees C. for any of selectively etching the SiGe with respect to the Si or selectively etching the Si with respect to the SiGe.

In the main etching, any of selectively etching the SiGe with respect to the Si or selectively etching the Si with respect to the SiGe may be performed using a cycle etching that repeats an etching process a plurality of times.

In the cycle etching, a purge process to purge the interior of the chamber 40 is performed between one etching process and another etching process. The interior of the chamber 40 may be purged only through an evacuation, but Ar gas as a purge gas may be made to flow simultaneously with the evacuation of the interior of the chamber 40.

By performing the cycle etching, roughness of the etched surface may be reduced, as compared with the roughness obtained when the etching process is performed once. In addition, although SiGe is protected by increasing the ratio of $NH_3$ gas, SiGe is etched to some extent. However, because an incubation time in etching the SiGe is longer than the incubation time in etching the Si, selectively etching the Si with respect to the SiGe may be performed using the cycle etching, thereby suppressing the etching of the SiGe to increase a selectivity of selectively etching the Si with respect to the SiGe.

In the cycle etching, it is possible to enhance the aforementioned effects by shortening an etching process time to increase the number of the etching process. However, if the number of the etching process is too large, a throughput is decreased. For this reason, considering the throughput, an appropriate number of cycles may be determined.

When both of the $NH_3$ gas and the $F_2$ gas are used in the main etching, $F_2$ gas may be introduced into the chamber 40 after the $NH_3$ gas is introduced into the chamber 40 to stabilize the pressure of chamber 40. Further, the pressure of chamber 40 may be stabilized by introducing Ar gas into the chamber 40.

After the main etching is performed as described above, the chamber 40 is evacuated while the Ar gas as a purge gas is supplied into the chamber 40, thereby purging the interior of the chamber 40. Subsequently, the gas system is switched over to the $NH_3$ gas and the HF gas, thereby protecting the etched surface.

Although the etched surface is extremely easily oxidized, the etched surface may be processed using the $NH_3$ gas and the HF gas such that the etched surface is terminated with hydrogen to be prevented from being oxidized.

According to the present embodiment as described above, both of selectively etching the SiGe with respect to the Si and selectively etching the Si with respect to the SiGe may be performed using the same gas system in the same chamber by varying the ratios of the $F_2$ gas and the $NH_3$ gas in an etching gas that has the gas system including the $F_2$ gas and the $NH_3$ gas.

EXPERIMENTAL EXAMPLES

Next, a description will be made on experimental examples.

Experimental Example 1

In Experimental Example 1, a blanket wafer having a poly-Si film formed thereon and another blanket wafer having a SiGe film formed thereon were prepared. Using $F_2$ gas and $NH_3$ gas as an etching gas, the poly-Si film and the SiGe film were etched by varying a $NH_3$ gas flow rate. The etching was performed under the following conditions:

$F_2$ gas flow rate: 180 sccm;
Ar gas flow rate: 1200 sccm;
Temperature: 80 degrees C.;
Pressure: 4 Torr/2 Torr;
Processing time: 8 sec/8 sec; and
Variation in the $NH_3$ gas flow rate: 1 to 100 sccm.

Figure 4:
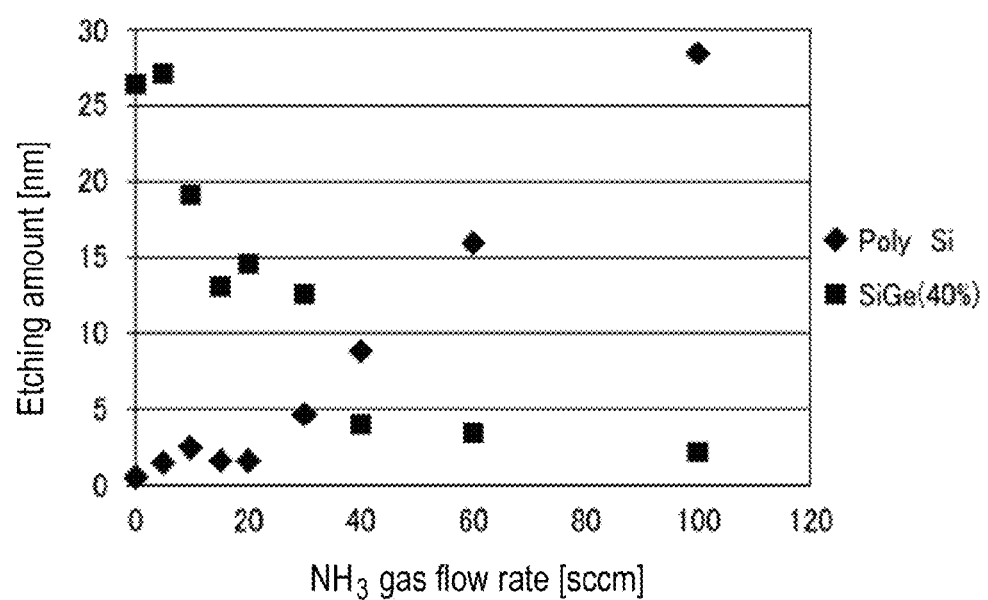
FIG. 4 is a view showing a relationship between a $NH_3$ gas flow rate and each etching amount of a poly-Si film and a SiGe film in Experimental Example 1.

The results are shown in FIG. 4. FIG. 4 shows the relationship between the $NH_3$ gas flow rate and each etching amount of the poly-Si film and the SiGe film. As shown in FIG. 4, it was confirmed that the poly-Si film was hardly etched and only the SiGe film was selectively etched when an etching gas including only $F_2$ gas was used. In contrast, it was confirmed that the etching amount of the poly-Si film increased but the etching amount of the SiGe film decreased, as the $NH_3$ gas increased. This is because an etching property of the poly-Si film increased, as the $NH_3$ gas increased, but an etching property of the SiGe film decreased by protective effect of the $NH_3$ gas, as the $NH_3$ gas increased.

It was confirmed that, when the $NH_3$ gas flow rate ranged from about 0 to 30 sccm [a flow rate ratio (i.e., a volume ratio) of the $NH_3$ gas flow rate with respect to a total flow rate of the etching gas: about 0 to 15%], an etching selection ratio of the SiGe film with respect to the poly-Si film became almost 2 or more, and when the $NH_3$ gas flow rate ranged from about 0 to 20 sccm [the flow rate ratio (i.e., the volume ratio) of the $NH_3$ gas flow rate with respect to the total flow rate of the etching gas: about 0 to 10%], the etching selection ratio of the SiGe film with respect to the poly-Si film became about 10 or more, thereby realizing the selective etching of the SiGe film. On the other hand, it was confirmed that, when the $NH_3$ gas flow rate was 40 sccm [the flow rate ratio (i.e., the volume ratio) of the $NH_3$ gas flow rate with respect to the total flow rate of the etching gas: 18.2%], the etching selection ratio of the poly-Si film with respect to the SiGe film became about 2, and when the $NH_3$ gas flow rate is 100 sccm [the flow rate ratio (i.e., the volume ratio) of the $NH_3$ gas flow rate with respect to the total flow rate of the etching gas: 35.7%], an etching selection ratio of the poly-Si film with respect to the SiGe film became about 15. Further, as shown in FIG. 4, it was confirmed that the etching selection ratio was about 2 or more when the volume ratio of $NH_3$ gas was 18% or higher, and the etching selection ratio was about 10 or more when the volume ratio of $NH_3$ gas was 30% or more, thereby realizing the selective etching of the poly-Si film. By further increasing the flow rate of the $NH_3$ gas, a selective etching property of the poly-Si film may be further improved.

Experimental Example 2

In Experimental Example 2, an effect of the cycle etching was evaluated.

At first, wafers that have a SiGe film formed on a Si film were etched by varying the number of cycles. Specifically, under conditions that a $F_2$ gas flow rate of 180 sccm, an Ar gas flow rate of 390 sccm, a $N_2$ gas flow rate of 810 sccm, a temperature of 80 degrees C., a pressure of 0.7 Torr were set, the wafers were etched by varying an etching time and the number of cycles per one etching process, for example, 48 sec×1 cycle, 16 sec×3 cycles, 8 sec×6 cycles, and 4 sec×12 cycles, respectively.

Figure 5:
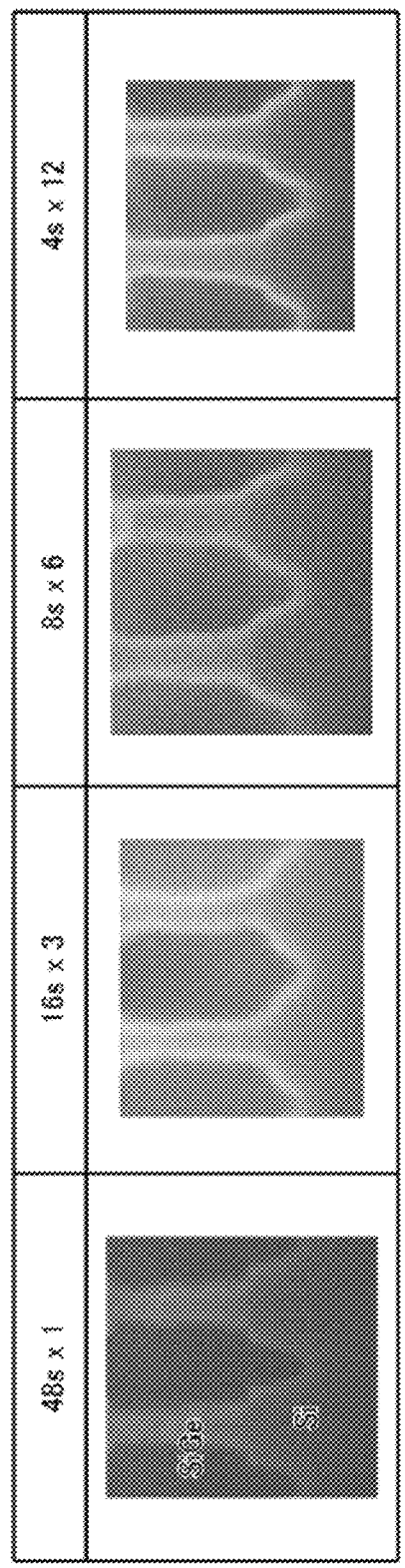
FIG. 5 is an SEM (Scanning Electron Microscope) photograph showing a state of an etched surface of a wafer that has a laminated structure of a poly-Si film and a SiGe film, when the etching was performed with respect to the wafer by varying the number of cycles.

FIG. 5 is a SEM (Scanning Electron Microscope) photograph showing a state of an etched surface of the SiGe film, when the wafers were etched by varying the number of cycles. As shown in FIG. 5, it was confirmed that roughness of the etched surface of the SiGe film was improved as the etching time per one etching process decreased and the number of cycles per one etching process increased.

Then, wafers that have a poly-Si film formed thereon were etched by varying the number of cycles. Specifically, under conditions that a $F_2$ gas flow rate of 250 sccm, a $NH_3$ gas flow rate of 50 sccm, an Ar gas flow rate of 1680 sccm, a temperature of 80 degrees C., a pressure of 2 Torr, the wafers were etched by varying an etching time and the number of cycles per one etching process, for example, 16 sec×2 cycles, 11 sec×3 cycles, and 8 sec×4 cycles, respectively.

FIG. 6 is a SEM photograph showing a state of an etched surface of the poly-Si film, when the wafers were etched by varying the number of cycles. As shown in FIG. 6, it was confirmed that roughness of the etched surface of the poly-Si film was also improved, as the etching time per one etching process decreased and the number of cycles per one etching process increased.

Other Applications of the Present Disclosure

The present disclosure is not limited to the aforementioned embodiments and may be differently modified. For example, the apparatuses of the aforementioned embodiments have been presented by way of example only. Indeed, the etching method according to the present disclosure may be implemented by apparatuses having different configurations. Further, there was shown an example in which a poly-Si film as a Si was used and a SiGe film as a SiGe was used, but an epitaxially-grown single crystal may be used. Further, while there has been illustrated a case where the semiconductor wafer is used as a target substrate, the target substrate is not limited to the semiconductor wafer. The target substrate may be other substrates such as a flat panel display (FPD) substrate represented by a liquid crystal display (LCD) substrate, a ceramic substrate, and the like.

According to some embodiments of the present disclosure, both of selectively etching a silicon-germanium with respect to a silicon and selectively etching the silicon with respect to the silicon-germanium may be performed by varying ratios of $NH_3$ gas and $F_2$ gas in an etching gas having a gas system including $F_2$ gas and $NH_3$ gas in the same chamber using the same gas system.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. An etching method, comprising:
disposing a target substrate including silicon and silicon-germanium within a chamber; and
performing both of selectively etching the silicon-germanium with respect to the silicon and selectively etching the silicon with respect to the silicon-germanium by varying ratios of $F_2$ gas and $NH_3$ gas in an etching gas that has a gas system including the $F_2$ gas and the $NH_3$ gas,
wherein both of selectively etching the silicon-germanium with respect to the silicon and selectively etching the silicon with respect to the silicon-germanium are performed using a cycle etching that repeats an etching process a plurality of times.

2. The etching method of claim 1, wherein the silicon is a silicon film, and the silicon-germanium is a silicon-germanium film.

3. The etching method of claim 1, wherein a volume ratio of the $NH_3$ gas to a total sum of the $F_2$ gas and the $NH_3$ gas falls within a range from 0 to 15 volume % in selectively etching the silicon-germanium with respect to the silicon, and wherein the volume ratio of the $NH_3$ gas to the total sum of the $F_2$ gas and the $NH_3$ gas falls within a range from 18 to 50 volume % in selectively etching the silicon with respect to the silicon-germanium.

4. The etching method of claim 1, wherein a volume ratio of the $NH_3$ gas to a total sum of the $F_2$ gas and the $NH_3$ gas falls within a range from 0 to 10 volume % in selectively etching the silicon-germanium with respect to the silicon, and wherein the volume ratio of the $NH_3$ gas to the total sum of the $F_2$ gas and the $NH_3$ gas falls within a range from 30 to 50 volume % in selectively etching the silicon with respect to the silicon-germanium.

5. The etching method of claim 1, wherein, during both of selectively etching the silicon-germanium with respect to the silicon and selectively etching the silicon with respect to the silicon-germanium, a temperature of a mounting table configured to mount the target substrate thereon falls within a range from 30 to 130 degrees C.

6. The etching method of claim 1, wherein, during both of selectively etching the silicon-germanium with respect to the silicon and selectively etching the silicon with respect to the silicon-germanium, an internal pressure of the chamber falls within a range from 66.7 to 667 Pa.

7. The etching method of claim 1, wherein evacuating an interior of the chamber is performed between one etching process and another etching process.

8. The etching method of claim 1, further comprising:
removing a natural oxide film of a surface of the target substrate by introducing $NH_3$ gas and HF gas into the chamber, before both of selectively etching the silicon-germanium with respect to the silicon and selectively etching the silicon with respect to the silicon-germanium are performed.

9. The etching method of claim 1, further comprising:
protecting the etched surface of the target substrate by introducing $NH_3$ gas and HF gas into the chamber, after both of selectively etching the silicon-germanium with respect to the silicon and selectively etching the silicon with respect to the silicon-germanium are performed.

10. A non-transitory storage computer-readable medium storing a program that operates on a computer and controls an etching apparatus, wherein the program, when executed, causes the computer to control the etching apparatus so as to perform the etching method of claim 1.

* * * * *